(12) United States Patent
Qing et al.

(10) Patent No.: US 12,424,143 B2
(45) Date of Patent: Sep. 23, 2025

(54) SHIFTING REGISTER WITH FEWER TRANSISTORS, DRIVING METHOD, GATE DRIVING CIRCUIT AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Haigang Qing, Beijing (CN); Ming Hu, Beijing (CN); Haijun Qiu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/650,484

(22) Filed: Apr. 30, 2024

(65) Prior Publication Data

US 2024/0282238 A1    Aug. 22, 2024

Related U.S. Application Data

(63) Continuation of application No. PCT/CN2023/070183, filed on Jan. 3, 2023.

(51) Int. Cl.
*G09G 3/32* (2016.01)
*G09G 3/20* (2006.01)
G09G 3/3266 (2016.01)
G11C 19/28 (2006.01)

(52) U.S. Cl.
CPC ............. *G09G 3/2092* (2013.01); *G09G 3/20* (2013.01); *G09G 3/3266* (2013.01); *G09G 2310/0286* (2013.01); *G11C 19/28* (2013.01); *G11C 19/287* (2013.01)

(58) Field of Classification Search
CPC ...... G09G 3/20; G09G 3/2092; G09G 3/3266; G09G 2310/0286; G11C 19/28; G11C 19/287
See application file for complete search history.

(56) References Cited

U.S. PATENT DOCUMENTS

| | | | |
|---|---|---|---|
| 2014/0055444 A1* | 2/2014 | Jang | G09G 3/3266 345/213 |
| 2021/0082329 A1* | 3/2021 | Chen | G09G 3/3266 |
| 2022/0254291 A1* | 8/2022 | Lai | G09G 3/20 |

* cited by examiner

*Primary Examiner* — Adam J Snyder
(74) *Attorney, Agent, or Firm* — IPro, PLLC

(57) ABSTRACT

The present disclosure relates to the field of display, and discloses a shifting register, a driving method, a gate driving circuit and a display device. The shifting register includes: an input sub-circuit, coupled to a signal input terminal, a first clock signal terminal and a first node; a control sub-circuit, coupled to the first clock signal terminal, a second clock signal terminal, the signal input terminal, a first power terminal, a second power terminal and a second node, where the first power terminal or the second power terminal determines a potential of the second node under the control of the first clock signal terminal, the second clock signal terminal and the signal input terminal; and an output sub-circuit, coupled to the first power terminal, the second power terminal, the first node, the second node and a signal output terminal.

14 Claims, 7 Drawing Sheets

In a signal holding output period, an input sub-circuit controls a first node to be in a maintained state according to signals of an input signal terminal and a first clock signal terminal; and a control sub-circuit controls a second node to be in a maintained state by a first power terminal or a second power terminal under the control of the first clock signal terminal, a second clock signal terminal and a signal input terminal, so that a signal output terminal outputs a delay holding signal — 201

In a high-level signal outputting period, the input sub-circuit controls the first node to be in an off state according to the signals of the input signal terminal and the first clock signal terminal; and the control sub-circuit controls the second node to be in an on state by the first power terminal or the second power terminal under the control of the first clock signal terminal, the second clock signal terminal and the signal input terminal, so that the signal output terminal outputs a high-level signal — 202

In a low-level signal outputting period, the input sub-circuit controls the first node to be in an on state according to the signals of the input signal terminal and the first clock signal terminal; and the control sub-circuit controls the second node to be in an off state by the first power terminal or the second power terminal under the control of the first clock signal terminal, the second clock signal terminal and the signal input terminal, so that the signal output terminal outputs a low-level signal — 203

Fig. 5

SHIFTING REGISTER WITH FEWER TRANSISTORS, DRIVING METHOD, GATE DRIVING CIRCUIT AND DISPLAY DEVICE

CROSS-REFERENCE TO RELATED APPLICATION

The application is a continuation of International Application No. PCT/CN2023/070183, filed on Jan. 3, 2023, which is hereby incorporated by reference in its entirety.

TECHNICAL FIELD

The present disclosure relates to the technical field of display, and provides a shifting register, a driving method, a gate driving circuit and a display device.

BACKGROUND

At present, a low temperature poly-silicon (LTPS) shifting registering circuit integrated on a display panel can generally achieve the following functions: achieving shifting output of high-level pulse signals by using an N-type transistor, and achieving shifting output of low-level pulse signals by using a P-type transistor. Correspondingly, a shifting registering circuit of an organic light emitting diode (OLED) needs to construct a high-level shifting registering circuit by using P-type transistors, and achieve adjustability of output pulse widths at the same time. So that, construction of shifting registering circuits related to OLEDs are more complex, and a circuit layout will occupy large space, which is not conducive to narrowing of a bezel of a relevant display device.

SUMMARY

Embodiments of the present disclosure provide a shifting register, a driving method, a gate driving circuit and a display device, which are used for simplifying a circuit connection relationship, thereby optimizing a circuit layout of the shifting registers.

The specific technical solution provided by the present disclosure is as follows.

In a first aspect, an embodiment of the present disclosure provides a shifting register, including:
  an input sub-circuit, coupled to a signal input terminal, a first clock signal terminal and a first node, where the input sub-circuit is configured to charge and reset the first node under the control of the first clock signal terminal;
  a control sub-circuit, coupled to the first clock signal terminal, a second clock signal terminal, the signal input terminal, a first power terminal, a second power terminal and a second node, where the control sub-circuit is configured to determine a potential of the second node by the first power terminal or the second power terminal under the control of the first clock signal terminal, the second clock signal terminal and the signal input terminal; and
  an output sub-circuit, coupled to the first power terminal, the second power terminal, the first node, the second node and a signal output terminal, where the output sub-circuit is configured to determine a potential of the signal output terminal by the first power terminal or the second power terminal under the control of the first node and the second node.

Optionally, the control sub-circuit includes a first transistor, a second transistor, a third transistor and a fourth transistor;
  a gate of the first transistor is coupled to the second clock signal terminal, a first electrode of the first transistor is coupled to the second power terminal, and a second electrode of the first transistor is coupled to a first electrode of the second transistor;
  a second electrode of the second transistor is coupled to a gate of the third transistor, and a gate of the second transistor is coupled to the signal input terminal;
  a first electrode of the third transistor is coupled to the second clock signal terminal, and a second electrode of the third transistor is coupled to a first electrode of the fourth transistor; and
  a gate of the fourth transistor is coupled to the second clock signal terminal.

Optionally, the input sub-circuit includes a fifth transistor; and
  a gate of the fifth transistor is coupled to the first clock signal terminal, a first electrode of the fifth transistor is coupled to the signal input terminal, and a second electrode of the fifth transistor is coupled to the first node.

Optionally, the control sub-circuit further includes a sixth transistor; and
  a gate of the sixth transistor is coupled to the first clock signal terminal, a first electrode of the sixth transistor is coupled to the first power terminal, and a second electrode of the sixth transistor is coupled to a gate of a third transistor.

Optionally, the control sub-circuit further includes a first capacitor; and
  a first terminal of the first capacitor is coupled to a gate of a third transistor, and a second terminal of the first capacitor is coupled to a second electrode of the third transistor.

Optionally, the output sub-circuit includes a seventh transistor, an eighth transistor and a second capacitor;
  a gate of the seventh transistor is coupled to the first power terminal, a first electrode of the seventh transistor is coupled to a second electrode of a fifth transistor, and a second electrode of the seventh transistor is coupled to a gate of the eighth transistor;
  a first electrode of the eighth transistor is coupled to the first power terminal, and a second electrode of the eighth transistor is coupled to the signal output terminal; and
  a first terminal of the second capacitor is coupled to the gate of the eighth transistor, and a second terminal of the second capacitor is coupled to the signal output terminal.

Optionally, the output sub-circuit further includes a ninth transistor, a tenth transistor and a third capacitor;
  a gate of the ninth transistor is coupled to a first electrode of a seventh transistor, a first electrode of the ninth transistor is coupled to the second power terminal, and a second electrode of the ninth transistor is coupled to a gate of the tenth transistor;
  a first electrode of the tenth transistor is coupled to the signal output terminal, and a second electrode of the tenth transistor is coupled to the second power terminal; and a first terminal of the third capacitor is coupled to the gate of the tenth transistor, and a second terminal of the third capacitor is coupled to the second power terminal.

In a second aspect, an embodiment of the present disclosure further provides a driving method of the above shifting register, including:

in a signal holding output period, controlling, by the input sub-circuit, the first node to be in a maintained state according to signals of the input signal terminal and the first clock signal terminal; and controlling, by the control sub-circuit, the second node to be in a maintained state by the first power terminal or the second power terminal under control of the first clock signal terminal, the second clock signal terminal and the signal input terminal, so that the signal output terminal outputs a delay holding signal;

in a high-level signal outputting period, controlling, by the input sub-circuit, the first node to be in an off state according to the signals of the input signal terminal and the first clock signal terminal; and controlling, by the control sub-circuit, the second node to be in an on state by the first power terminal or the second power terminal under control of the first clock signal terminal, the second clock signal terminal and the signal input terminal, so that the signal output terminal outputs a high-level signal; and in a low-level signal outputting period, controlling, by the input sub-circuit, the first node to be in an on state according to the signals of the input signal terminal and the first clock signal terminal; and controlling, by the control sub-circuit, the second node to be in an off state by the first power terminal or the second power terminal under control of the first clock signal terminal, the second clock signal terminal and the signal input terminal, so that the signal output terminal outputs a low-level signal.

In a third aspect, a gate driving circuit includes a plurality of cascaded shifting registers above;

an input signal terminal of a first stage of shifting register is configured to be coupled to a frame start signal terminal; and in every two adjacent shifting registers, an input signal terminal of the next stage of shifting register is configured to be coupled to an output terminal of the previous stage of shifting register.

In a fourth aspect, a display device includes the above gate driving circuit.

The present disclosure has the following beneficial effects.

In conclusion, the embodiments of the present disclosure provide the shifting register, the driving method, the gate driving circuit and the display device. The shifting register includes: the input sub-circuit, coupled to the signal input terminal, the first clock signal terminal and the first node, where the input sub-circuit is configured to charge and reset the first node under the control of the first clock signal terminal; the control sub-circuit, coupled to the first clock signal terminal, the second clock signal terminal, the signal input terminal, the first power terminal, the second power terminal and the second node, where the control sub-circuit is configured to determine the potential of the second node by the first power terminal or the second power terminal under the control of the first clock signal terminal, the second clock signal terminal and the signal input terminal; and the output sub-circuit, coupled to the first power terminal, the second power terminal, the first node, the second node and the signal output terminal, where the output sub-circuit is configured to determine the potential of the signal output terminal by the first power terminal or the second power terminal under the control of the first node and the second node. In this way, the number of the transistors in the shifting register is effectively reduced, then a circuit connection relationship is simplified, and the circuit layout of the shifting register is optimized.

Other features and advantages of the present disclosure will be described in the following description, and will become apparent in part from the description, or will be understood by implementing the present disclosure. The object and other advantages of the present disclosure can be realized and obtained by the structure specially pointed out in the description, claims and drawings.

BRIEF DESCRIPTION OF FIGURES

The accompanying drawings illustrated herein are intended to provide a further understanding of the present disclosure, and form a part of the present disclosure. Schematic embodiments of the present disclosure and their illustration are used to explain the present disclosure, but do not constitute a limitation to the present disclosure.

FIG. 5 is a schematic flow diagram of a driving method of a shifting register in an embodiment of the present disclosure.

DETAILED DESCRIPTION

To make the objects, technical solutions and advantages of embodiments of the present disclosure clearer, the technical solutions in the present disclosure will be clearly and completely described below in conjunction with the accompanying drawings in the embodiments of the present disclosure, and it is apparent that the described embodiments are a part of the embodiments of the technical solutions of the present disclosure rather than all the embodiments. Based on the embodiments of the present disclosure, all other embodiments obtained by those of ordinary skill in the art without creative work shall fall within the protection scope of the technical solutions of the present disclosure.

In the specification, claims, and foregoing accompanying drawings of the present disclosure, the terms "first", "second", and so on are intended to distinguish similar objects, and are not necessarily used for describing a specific order or sequence. It is to be understood that such used data are interchangeable where appropriate, so that the embodiments of the present disclosure described here can be implemented in an order other than those illustrated or described here.

In the related art, P-type transistors are used for constructing a light emitting control shifting register, and the above shifting register may achieve high-level shifting and high-level pulse width adjustment. But in order to achieve shifting output of pulse signals of the shifting register, more transistors are adopted in a circuit of the above shifting register, a circuit connection relationship is complex, and the large layout space is occupied, which is not quite conducive to narrowing of a display bezel.

Preferred implementations of the present disclosure are described in detail below in combination with the accompanying drawings.

Figure 1:
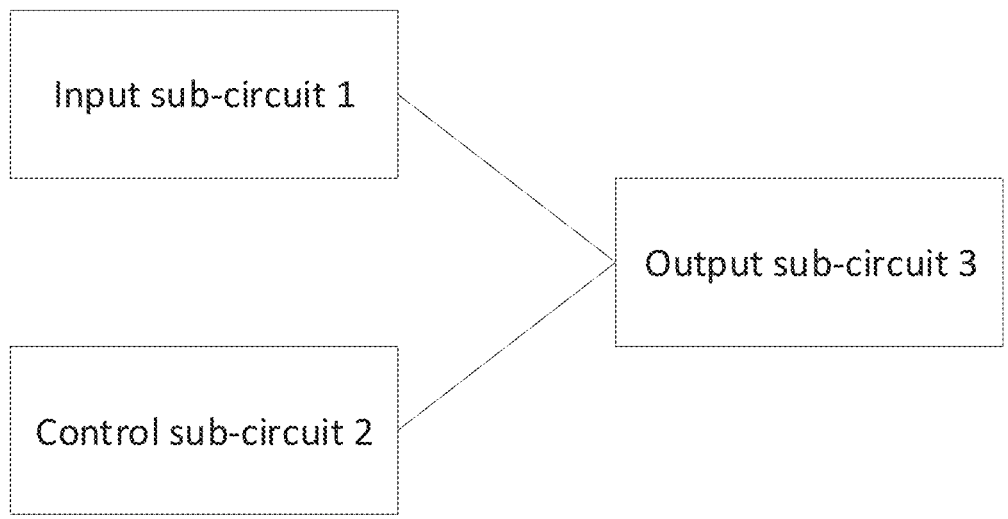
FIG. 1 is a schematic diagram of sub-circuit connection of a shifting register in an embodiment of the present disclosure.

Referring to FIG. 1, in an embodiment of the present disclosure, a shifting register specifically includes: an input sub-circuit 1, a control sub-circuit 2 and an output sub-circuit 3. The input sub-circuit 1 is coupled to a signal input terminal, a first clock signal terminal and a first node; and the input sub-circuit 1 is configured to charge and reset the first node under the control of the first clock signal terminal.

Figure 2:
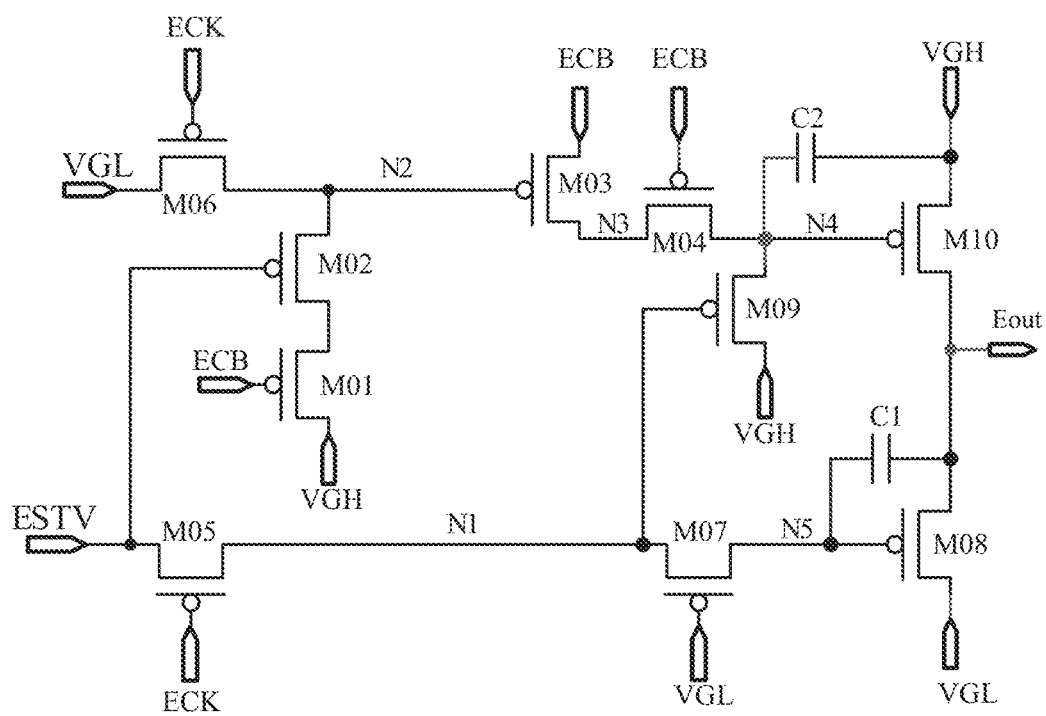
FIG. 2 is a schematic structural diagram of a shifting register in an embodiment of the present disclosure.

Referring to FIG. 2, during specific implementation, an input signal ESTV is input into the input sub-circuit 1 via the above signal input terminal, and the input sub-circuit 1 is further coupled to the first clock signal terminal and the first node. It should be noted that, the above first node includes a node N1 and a node N5 in FIG. 2. When a first clock signal ECK is at a low level, a fifth transistor M05 is turned on. if the input signal ESTV is at a high level, a charging function for the first node is achieved; and if the input signal ESTV is at a low level, a reset function for the first node is achieved. Specifically, the first clock signal ECK is input into the input sub-circuit 1 via the above first clock signal terminal, that is, the input sub-circuit 1 is controlled by the first clock signal ECK. The above input sub-circuit 1 includes the fifth transistor M05, a gate of the fifth transistor M05 is coupled to the first clock signal terminal, a first electrode of the fifth transistor M05 is coupled to the signal input terminal, and a second electrode of the fifth transistor M05 is coupled to the first node N1.

During specific implementation, the above first clock signal ECK acts on the gate of the fifth transistor M05, and a high or low signal level of the first clock signal ECK directly determines whether the fifth transistor M05 is in an on state or an off state. Moreover, the first electrode of the fifth transistor M05 is coupled to the signal input terminal, that is, the above input signal ESTV is input into the input sub-circuit 1 via the first electrode of the fifth transistor M05, and the second electrode of the fifth transistor M05 is used for outputting. Specifically, the first node N1 is used for representing an output of the second electrode of the fifth transistor M05, and the second electrode of the above fifth transistor M05 is coupled to the output sub-circuit 3. Specifically, a seventh transistor M07 is further arranged between the second electrode of the above fifth transistor M05 and the output sub-circuit 3, another first node N5 is further arranged between a second electrode of the seventh transistor M07 and a signal output terminal. In order to distinguish the node N5 from the node N1, the above node N5 is referred to as a fifth node N5 in subsequent descriptions.

It should further be noted that, the first node N1 and the fifth node N5 are both virtual nodes in the shifting register, and are only for the convenience of the description for the structure and signal transmission of the shifting register. The specific structure and signal transmission of the shifting register may be determined according to coupling manners between transistors and capacitors in the shifting register.

The control sub-circuit 2 is coupled to the first clock signal terminal, a second clock signal terminal, the signal input terminal, a first power terminal, a second power terminal and a second node; and the control sub-circuit 2 is configured to determine a potential of the second node by the first power terminal or the second power terminal under the control of the first clock signal terminal, the second clock signal terminal and the signal input terminal.

In order to achieve shifting output of the signal ESTV, the control sub-circuit 2 in the embodiments of the present disclosure performs control based on the first clock signal ECK, a second clock signal ECB, the signal input terminal ESTV, a first power signal VGL, a second power signal VGH and the second node (e.g., a node N2, a node N3 and a node N4 in FIG. 2 are collectively referred to as the second node). Specifically, the control sub-circuit is respectively coupled to the first clock signal terminal, the second clock signal terminal, the first power terminal and the second power terminal.

Moreover, the control sub-circuit 2 in the embodiments of the present disclosure can achieve a control function with fewer transistors. Specifically, the control sub-circuit 2 includes a first transistor M01, a second transistor M02, a third transistor M03 and a fourth transistor M04. A gate of the first transistor M01 is coupled to the second clock signal terminal, a first electrode of the first transistor M01 is coupled to the second power terminal, and a second electrode of the first transistor M01 is coupled to a first electrode of the second transistor M02; a second electrode of the second transistor M02 is coupled to a gate of the third transistor M03, and a gate of the second transistor M02 is coupled to the signal input terminal; and a first electrode of the third transistor M03 is coupled to the second clock signal terminal, a second electrode of the third transistor M03 is coupled to a first electrode of the fourth transistor M04, and a gate of the fourth transistor M04 is coupled to the second clock signal terminal.

During specific implementation, on and off of the above first transistor M01 are controlled by the second clock signal ECB, on and off of the above second transistor M02 are controlled by ESTV, on and off of the above third transistor M03 are controlled by the second node N2, and on and off of the above fourth transistor M04 are controlled by the second clock signal ECB. Similarly, the above second node N2 is also a virtual node. For the convenience of distinguishing the node N2, the node N3 and the node N4 in the above second node, in subsequent descriptions, the node N3 is referred to as a third node N3, which is arranged between the third transistor M03 and the fourth transistor M04; and the node N4 is referred to a fourth node N4, which is arranged between the fourth transistor M04 and a tenth transistor M10.

In addition, it should further be noted that, the control sub-circuit 2 further includes a sixth transistor M06, a gate of the sixth transistor M06 is coupled to the first clock signal terminal, a first electrode of the sixth transistor M06 is coupled to the first power terminal, and a second electrode of the sixth transistor M06 is coupled to the gate of the third transistor M03.

During specific implementation, on and off of the above sixth transistor M06 are controlled by the first clock signal ECK, and the second electrode of the sixth transistor M06 is connected with the gate of the third transistor M03 through the above second node N2.

Figure 3:
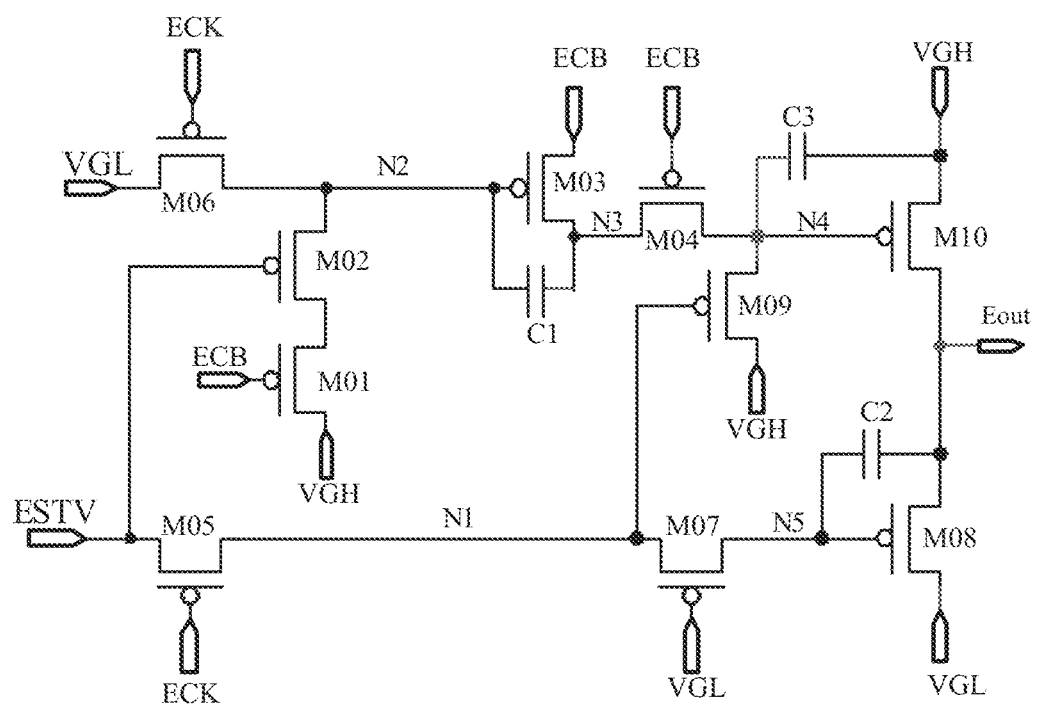
FIG. 3 is a schematic structural diagram of another shifting register in an embodiment of the present disclosure.

Referring to FIG. 3, in order to make a level output by the third transistor M03 reach the first power signal VGL, the control sub-circuit 2 further includes a first capacitor C1, a first terminal of the first capacitor C1 is coupled to the gate of the third transistor M03, and a second terminal of the first capacitor C1 is coupled to the second electrode of the third transistor M03.

During specific implementation, the above first capacitor C1 is a bootstrap capacitor, and through a bootstrap effect of the first capacitor C1, the turn-on degree of the third transistor M03 can be as large as possible, so that the first power signal VGL is output to the third node N3 smoothly. Similarly, the third node N3 is also a virtual node in the shifting register.

The output sub-circuit 3 is coupled to the first power terminal, the second power terminal, the first node, the second node and the signal output terminal; and the output sub-circuit 3 is configured to determine a potential of the signal output terminal by the first power terminal or the second power terminal under the control of the first node and the second node.

In the embodiments of the present disclosure, the output of high-level and low-level signals of the shifting register is achieved through the output sub-circuit 3.

In order to output the low-level signal, the output sub-circuit 3 includes the seventh transistor M07, an eighth transistor M08 and a second capacitor C2. A gate of the seventh transistor M07 is coupled to the first power terminal, a first electrode of the seventh transistor M07 is coupled to the second electrode of the fifth transistor M05, the second electrode of the seventh transistor M07 is coupled to a gate of the eighth transistor M08, a first electrode of the eighth transistor M08 is coupled to the first power terminal, a second electrode of the eighth transistor M08 is coupled to the signal output terminal, a first terminal of the second capacitor C2 is coupled to the gate of the eighth transistor M08, and a second terminal of the second capacitor C2 is coupled to the signal output terminal.

During specific implementation, on and off of the above seventh transistor M07 are controlled by the first power signal VGL, and on and off of the above eighth transistor M08 are controlled by an output signal of the second electrode of the seventh transistor M07 (i.e., a signal at the fifth node N5). Since the signal output terminal is pulled down to a low level by the eighth transistor M08, in a potential lowering process of the signal output terminal, potential lowering of the signal output terminal causes the gate of the eighth transistor M08 to be coupled lower through the above second capacitor C2, so that potential lowering of the signal output terminal is faster to form positive feedback.

In order to output a high level, the output sub-circuit 3 further includes a ninth transistor M09, the tenth transistor M10 and a third capacitor C3. A gate of the ninth transistor M09 is coupled to the first electrode of the seventh transistor M07, a first electrode of the ninth transistor M09 is coupled to the second power terminal, a second electrode of the ninth transistor M09 is coupled to a gate of the tenth transistor M10, a first electrode of the tenth transistor M10 is coupled to the signal output terminal, a second electrode of the tenth transistor M10 is coupled to the second power terminal, a first terminal of the third capacitor C3 is coupled to the gate of the tenth transistor M10, and a second terminal of the third capacitor C3 is coupled to the second power terminal.

During specific implementation, on and off of the above ninth transistor M09 are controlled by the first node N1, and on and off of the above tenth transistor M10 are controlled by a signal at the fourth node N4. In order to output the high-level signal smoothly, namely guaranteeing that the tenth transistor M10 is turned on as far as possible, after the low-level signal is transmitted to the gate of the tenth transistor M10 through the fourth transistor M04, the low-level signal is stored at the third capacitor C3, and under the action of the third capacitor C3, the tenth transistor M10 is turned on. The second power signal VGH reaches the signal output terminal through the tenth transistor M10, so that the signal output terminal outputs a high level.

It should be noted that, the input sub-circuit 1, the control sub-circuit 2 and the output sub-circuit 3 above include the same type of transistors.

Preferably, the above transistors are P-type transistors. In the embodiments of the present disclosure, the P-type transistors are taken for specific description, and the P-type transistors are cut off under the action of the high-level signal and conducted under the action of the low-level signal. In other embodiments, the above transistors may also be N-type transistors, and the N-type transistors are conducted under the action of the high-level signal and cut off under the action of the low-level signal. When the N-type transistors are adopted to achieve the output of the shifting register, the process is similar, which is omitted here.

Figure 4:
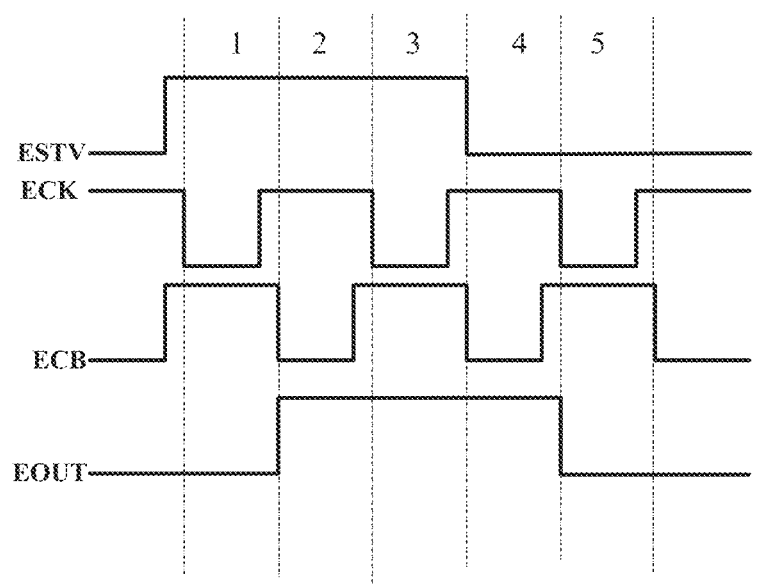
FIG. 4 is a signal sequence diagram corresponding to a shifting register in an embodiment of the present disclosure.

Referring to FIG. 4 which is a signal sequence diagram corresponding to the shifting register, and a working process of the shifting register is described below in combination with FIG. 4. It should be noted that, in the following description, 1 represents a high-level signal, and 0 represents a low-level signal, where 1 and 0 are logic levels, which are only used for better understanding a specific working process in the embodiments of the present disclosure, instead of voltages applied to gates of transistors during specific implementation.

In a period of a time sequence 1, an input signal ESTV is at a high level, a second clock signal ECB is at a high level, a first clock signal ECK is at a low level, a fifth transistor M05 and a sixth transistor M06 are turned on, a second transistor M02, a first transistor M01 and a fourth transistor M04 are cut off, the high level of the input signal ESTV is written into a second capacitor C2 through the fifth transistor M05 and a seventh transistor M07, and a first node N1 and a fifth node N5 are both at a high level, so that, a ninth transistor M09 and an eighth transistor M08 are both cut off, meanwhile, the sixth transistor M06 is turned on, a low level of a first power signal VGL pulls down a second node N2 to a low level through the sixth transistor M06, a third transistor M03 is turned on, a third node N3 is written as a high level, the fourth transistor M04 is cut off, a fourth node N4 is maintained in a high level state of the last period, and a tenth transistor M10 is cut off. Since the tenth transistor M10 and the eighth transistor M08 are both cut off, output of the circuit is maintained in a state of the last period and is kept unchanged.

In a period of a time sequence 2, the input signal ESTV is at a high level, the first clock signal ECK is at a high level, the second clock signal ECB is at a low level, the fifth transistor M05, the second transistor M02 and the sixth transistor M06 are all cut off, the first transistor M01 and the fourth transistor M04 are both turned on, and the first node N1 and the second node N2 are both maintained unchanged, so that, the ninth transistor M09 and the eighth transistor M08 are still in an off state, the third transistor M03 is kept turned on, the low level of the second clock signal ECB is output in a bootstrap mode through the third transistor M03 and a first capacitor C1, and thus the output level may reach a level of the first power signal VGL. The level of the above first power signal VGL is transmitted to the gate of the tenth transistor M10 through the fourth transistor M04 (i.e., through the fourth node N4) and stored at a third capacitor C3, a low level of the fourth node N4 makes the tenth transistor M10 turned on, a second power signal VGH reaches a signal output terminal through the tenth transistor M10, and thus the signal output terminal outputs a high level.

In a period of a time sequence 3, the input signal ESTV is at a high level, the second clock signal ECB is at a high level, the first clock signal ECK is at a low level, the second transistor M02, the first transistor M01 and the fourth transistor M04 are all cut off, the fifth transistor M05 and the sixth transistor M06 are turned on, a high level is written into the first node N1 through the fifth transistor M05, a low level is written into the second node N2 through the sixth transistor M06, and the states of the first node N1 and the second node N2 are still consistent with the states in the last period, so that, the ninth transistor M09 and the eighth transistor M08 are still in an off state, and the third transistor M03 is kept turned on. Although the high level of the second clock signal ECB is written into the third node N3 through the third transistor M03, the fourth transistor M04 is cut off, and thus, the state of the fourth node N4 is maintained unchanged as the last period. The tenth transistor M10 is still turned on, the second power signal VGH reaches the signal output terminal through the tenth transistor M10, and thus the signal output terminal is still at a high level.

In a period of a time sequence 4, the input signal ESTV is at a low level, the second clock signal ECB is at a low level, the first clock signal ECK is at a high level, the fifth transistor M05 and the sixth transistor M06 are both cut off, the second transistor M02, the first transistor M01 and the fourth transistor M04 are all turned on, the first node N1 is maintained unchanged, and the ninth transistor M09 is cut off. Since the second transistor M02 and the first transistor M01 are both turned on, and a high level is written into the second node N2, the third transistor M03 is cut off. Since the third transistor M03 and the ninth transistor M09 are cut off, the fourth node N4 is maintained unchanged in the previous state, the tenth transistor M10 is still turned on, the second power signal VGH reaches the signal output terminal through the tenth transistor M10, and thus the signal output terminal is still at the high level.

In a period of a time sequence 5, the input signal ESTV is at a low level, the first clock signal ECK is at a low level, the second clock signal ECB is at a high level, the fifth transistor M05, the second transistor M02 and the sixth transistor M06 are turned on, the first transistor M01 and the fourth transistor M04 are both cut off, the low level of the input signal ESTV is written into the second capacitor C2 through the fifth transistor M05 and saved therein, the first node N1 becomes to be at a low level, so that, the ninth transistor M09 and the eighth transistor M08 are turned on. Since the fourth transistor M04 is cut off and the ninth transistor M09 is turned on, the fourth node N4 is pulled up to a high level through the ninth transistor M09 and is maintained at the high level through the third capacitor C3, thus, the tenth transistor M10 is cut off, the fifth node N5 is at a low level, the eighth transistor M08 is turned on, and the signal output terminal is pulled down to a low level through the eighth transistor M08. In the potential lowering process of the signal output terminal, potential lowering of the signal output terminal causes the gate of the eighth transistor M08 to be coupled lower through the second capacitor C2, and thus potential lowering of the signal output terminal is faster to form positive feedback. Meanwhile, while a potential of the fifth node N5 is lowered, since a potential of a gate of the seventh transistor M07 is fixed, the seventh transistor M07 will be in an off state, and thus a low level of the eighth transistor M08 is output more smoothly.

So far, before a next high level of the input signal ESTV reaches, the shifting register will continue to maintain the low level output, and subsequent periods will not be repeated.

Based on the same inventive concept, referring to FIG. 5, an embodiment of the present disclosure provides a driving method of the above shifting register, including the following.

Step 201: in a signal holding output period, an input sub-circuit controls a first node to be in a maintained state according to signals of an input signal terminal and a first clock signal terminal; and a control sub-circuit controls a second node to be in a maintained state by a first power terminal or a second power terminal under the control of the first clock signal terminal, a second clock signal terminal and a signal input terminal, so that a signal output terminal outputs a delay holding signal.

During specific implementation, in order to achieve shifting output of the shifting register, circuits where the first node and the second node above are located are both in a maintained state. In this way, a high level and a low level in an input signal ESTV cannot be output, and thus the purpose of delayed output is achieved. A time length of delayed output of the signal output terminal is a duration of delayed output.

Step 202: in a high-level signal outputting period, the input sub-circuit controls the first node to be in an off state according to the signals of the input signal terminal and the first clock signal terminal; and the control sub-circuit controls the second node to be in an on state by the first power terminal or the second power terminal under the control of the first clock signal terminal, the second clock signal terminal and the signal input terminal, so that the signal output terminal outputs a high-level signal.

During specific implementation, in order to achieve the output of a high-level signal of the shifting register, the circuit where the second node is located is controlled by the control sub-circuit to be in an on state, and meanwhile, the circuit where the first node is located is controlled to be in an off state. In this way, under the action of the second node, the signal output terminal outputs the high-level signal.

Step 203: in a low-level signal outputting period, the input sub-circuit controls the first node to be in an on state according to the signals of the input signal terminal and the first clock signal terminal; and the control sub-circuit controls the second node to be in an off state by the first power terminal or the second power terminal under the control of the first clock signal terminal, the second clock signal terminal and the signal input terminal, so that the signal output terminal outputs a low-level signal.

During specific implementation, in order to achieve the output of a low-level signal of the shifting register, the circuit where the second node is located is controlled by the control sub-circuit to be in an off state, and meanwhile, the circuit where the first node is located is controlled to be in an on state. In this way, under the action of the first node, the signal output terminal outputs the low-level signal.

Figure 6:
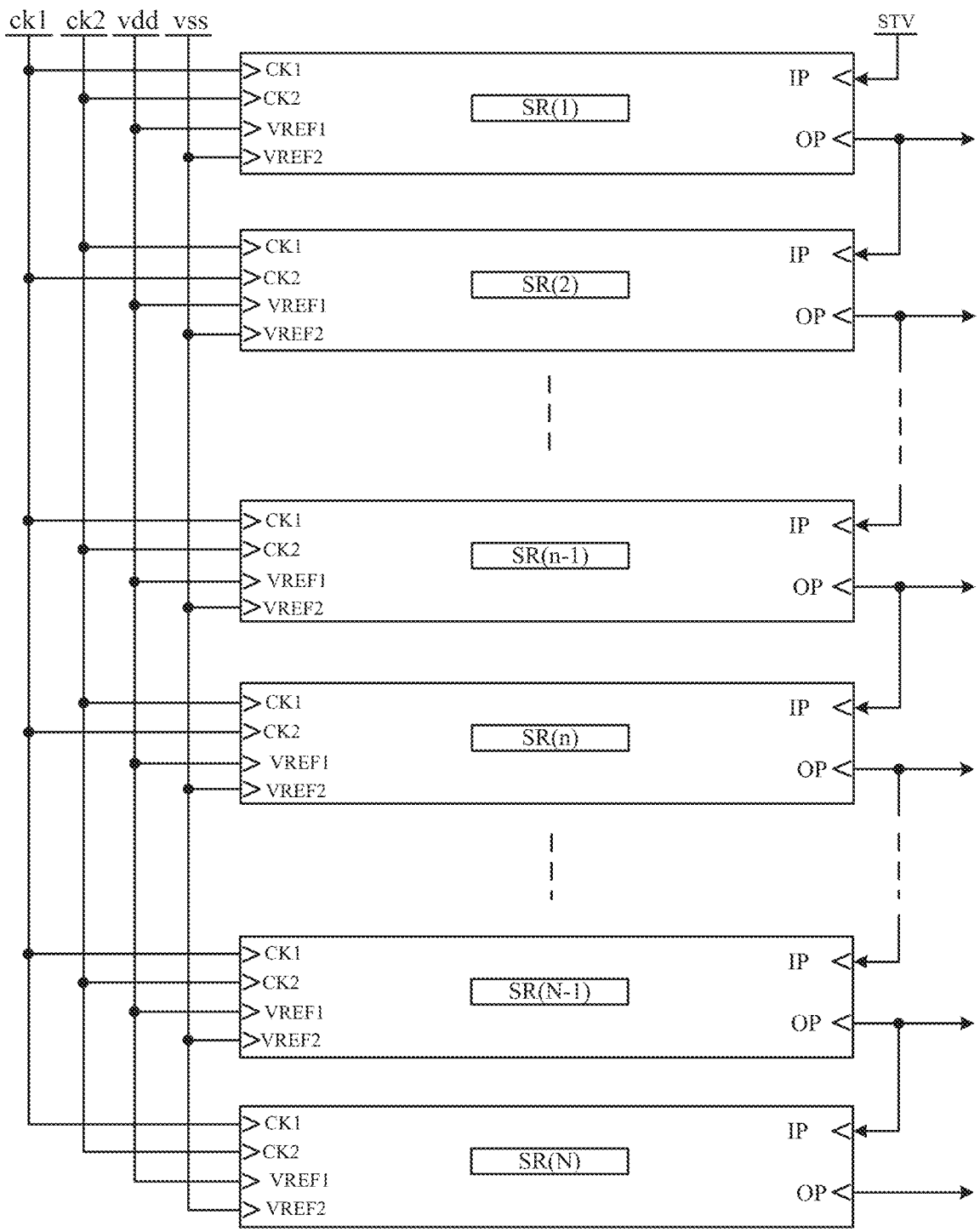
FIG. 6 is a schematic structural diagram of a gate driving circuit in an embodiment of the present disclosure.

Based on the same inventive concept, referring to FIG. 6, an embodiment of the present disclosure provides a gate driving circuit, including a plurality of cascaded shifting registers above. An input signal terminal of the first stage of shifting register is configured to be coupled to a frame start signal terminal, and in every two adjacent shifting registers, an input signal terminal of the next stage of shifting register is configured to be coupled to an output terminal of the previous stage of shifting register.

The above gate driving circuit may be configured in a liquid crystal display panel, or in an electroluminescent display panel, which is not limited here.

Specifically, a first reference signal terminal VREF1 of each stage of shifting register SR(n) is coupled to the same direct current signal terminal vdd, and a second reference signal terminal VREF2 of each stage of shifting register SR(n) is coupled to the same direct current signal terminal vss. A first clock signal terminal CK1 of the $(2k-1)^{th}$ stage of shifting register and a second clock signal terminal CK2 of the $(2k)^{th}$ stage of shifting register are both coupled to the same clock terminal, namely a first clock signal terminal ck1; and a second clock signal terminal CK2 of the $(2k-1)^{th}$ stage of shifting register and a first clock signal terminal CK1 of the $(2k)^{th}$ stage of shifting register are both coupled to the same clock terminal, namely a second clock terminal ck2, where k is a positive integer.

Figure 7:
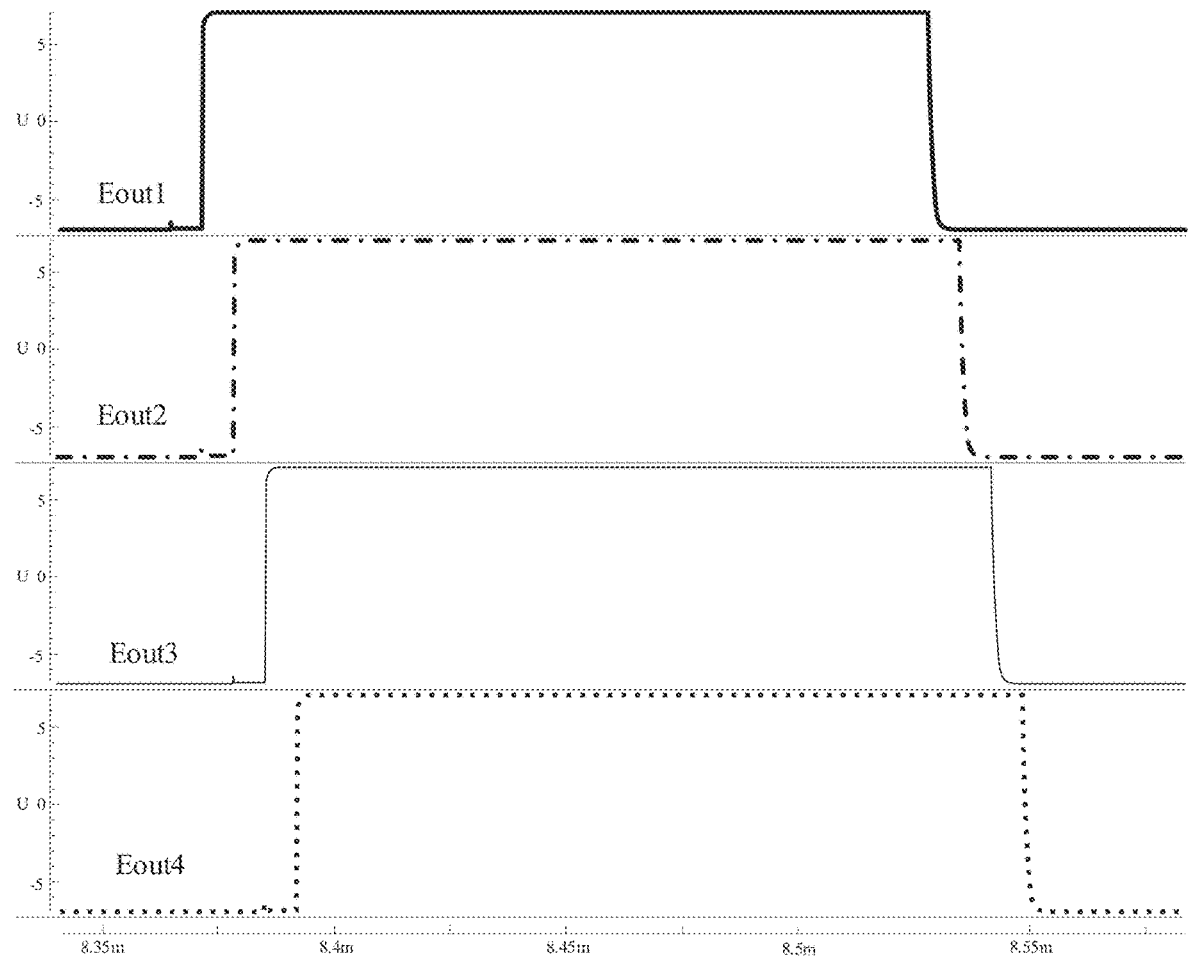
FIG. 7 is a simulation diagram of a gate driving circuit in an embodiment of the present disclosure.

Referring to FIG. 7, simulation is performed with four cascaded shifting registers above, and it is found that waveforms of the output Eout1 of the first stage of shifting register, the output Eout2 of the second stage of shifting register, the output Eout3 of the third stage of shifting register and the output Eout4 of the fourth stage of shifting register are delayed in sequence, that is, the sequential delayed output of the input signal ESTV in various stages of the shifting registers is realized.

Based on the same inventive concept, an embodiment of the present disclosure provides a display device, including the above gate driving circuit.

The principle for solving problems of the display device is similar to that of the aforementioned shifting register, and thus the implementation of the display device can refer to the implementation of the aforementioned shifting register, which will not be repeated here.

The above display device provided by the embodiments of the present disclosure may also be any product or component with a display function such as a tablet computer, a television, a display, a laptop, a digital photo frame and a navigator. Other essential components of the display device shall be understood by those of ordinary skill in the art, and are not described herein, nor should they be taken as limitations on the present disclosure.

In conclusion, the embodiments of the present disclosure provide the shifting register, the driving method, the gate driving circuit and the display device. The shifting register includes: the input sub-circuit, coupled to the signal input terminal, the first clock signal terminal and the first node, where the input sub-circuit is configured to charge and reset the first node under the control of the first clock signal terminal; the control sub-circuit, coupled to the first clock signal terminal, the second clock signal terminal, the signal input terminal, the first power terminal, the second power terminal and the second node, where the control sub-circuit is configured to determine the potential of the second node by the first power terminal or the second power terminal under the control of the first clock signal terminal, the second clock signal terminal and the signal input terminal; and the output sub-circuit, coupled to the first power terminal, the second power terminal, the first node, the second node and the signal output terminal, where the output sub-circuit is configured to determine the potential of the signal output terminal by the first power terminal or the second power terminal under the control of the first node and the second node. In this way, the number of the transistors in the shifting register is effectively reduced, then a circuit connection relationship is simplified, and the circuit layout of the shifting register is optimized.

Those skilled in the art will appreciate that the embodiments of the present disclosure may be provided as methods, systems, or computer program product systems. Therefore, the present disclosure may take the form of a full hardware embodiment, a full software embodiment, or an embodiment combining software and hardware. Besides, the present disclosure may adopt the form of a computer program product system implemented on one or more computer available storage media (including, but not limited to, a disk memory, a compact disc read-only memory (CD-ROM), an optical memory and the like) containing computer available program codes.

The present disclosure is described with reference to the flow diagrams and/or block diagrams of the method, apparatus (system), and computer program product system according to the present disclosure. It should be understood that each flow and/or block in the flow diagram and/or block diagram and the combination of flows and/or blocks in the flow diagram and/or block diagram can be implemented by computer program instructions. These computer program instructions can be provided to processors of a general-purpose computer, a special-purpose computer, an embedded processor or other programmable data processing devices to generate a machine, so that instructions executed by processors of a computer or other programmable data processing devices generate an apparatus for implementing the functions specified in one or more flows of the flow diagram and/or one or more blocks of the block diagram.

These computer program instructions can also be stored in a computer-readable memory capable of guiding a computer or other programmable data processing devices to work in a specific manner, so that instructions stored in the computer-readable memory generate a manufacturing product including an instruction apparatus, and the instruction apparatus implements the functions specified in one or more flows of the flow diagram and/or one or more blocks of the block diagram.

These computer program instructions can also be loaded on a computer or other programmable data processing devices, so that a series of operation steps are executed on the computer or other programmable devices to produce computer-implemented processing, and thus, the instructions executed on the computer or other programmable devices provide steps for implementing the functions specified in one or more flows of the flow diagram and/or one or more blocks of the block diagram.

Apparently, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A shifting register, comprising:
an input sub-circuit, coupled to a signal input terminal, a first clock signal terminal and a first node; wherein the input sub-circuit is configured to charge and reset the first node under control of the first clock signal terminal;
a control sub-circuit, coupled to the first clock signal terminal, a second clock signal terminal, the signal input terminal, a first power terminal, a second power terminal and a second node; wherein the control sub-circuit is configured to determine a potential of the second node by the first power terminal or the second power terminal under control of the first clock signal terminal, the second clock signal terminal and the signal input terminal; and an output sub-circuit, coupled to the first power terminal, the second power terminal, the first node, the second node and a signal output terminal; wherein the output sub-circuit is configured to determine a potential of the signal output terminal by the first power terminal or the second power terminal under control of the first node and the second node;

wherein the control sub-circuit comprises a first transistor, a second transistor, a third transistor and a fourth transistor;

a gate of the first transistor is coupled to the second clock signal terminal, a first electrode of the first transistor is directly coupled to the second power terminal, and a second electrode of the first transistor is coupled to a first electrode of the second transistor;

a second electrode of the second transistor is coupled to a gate of the third transistor, and a gate of the second transistor is directly coupled to the signal input terminal;

a first electrode of the third transistor is coupled to the second clock signal terminal, and a second electrode of the third transistor is coupled to a first electrode of the fourth transistor; and a gate of the fourth transistor is coupled to the second clock signal terminal.

2. The shifting register according to claim 1, wherein the input sub-circuit comprises a fifth transistor; and a gate of the fifth transistor is coupled to the first clock signal terminal, a first electrode of the fifth transistor is coupled to the signal input terminal, and a second electrode of the fifth transistor is coupled to the first node.

3. The shifting register according to claim 1, wherein the control sub-circuit further comprises a sixth transistor; and a gate of the sixth transistor is coupled to the first clock signal terminal, a first electrode of the sixth transistor is coupled to the first power terminal, and a second electrode of the sixth transistor is coupled to the gate of the third transistor.

4. The shifting register according to claim 1, wherein the control sub-circuit further comprises a first capacitor; and a first terminal of the first capacitor is coupled to the gate of the third transistor, and a second terminal of the first capacitor is coupled to the second electrode of the third transistor.

5. The shifting register according to claim 1, wherein the output sub-circuit comprises a seventh transistor, an eighth transistor and a second capacitor;

a gate of the seventh transistor is coupled to the first power terminal, a first electrode of the seventh transistor is coupled to a second electrode of a fifth transistor, and a second electrode of the seventh transistor is coupled to a gate of the eighth transistor;

a first electrode of the eighth transistor is coupled to the first power terminal, and a second electrode of the eighth transistor is coupled to the signal output terminal; and a first terminal of the second capacitor is coupled to the gate of the eighth transistor, and a second terminal of the second capacitor is coupled to the signal output terminal.

6. The shifting register according to claim 1, wherein the output sub-circuit further comprises a ninth transistor, a tenth transistor and a third capacitor;

a gate of the ninth transistor is coupled to a first electrode of a seventh transistor, a first electrode of the ninth transistor is coupled to the second power terminal, and a second electrode of the ninth transistor is coupled to a gate of the tenth transistor;

a first electrode of the tenth transistor is coupled to the signal output terminal, and a second electrode of the tenth transistor is coupled to the second power terminal; and a first terminal of the third capacitor is coupled to the gate of the tenth transistor, and a second terminal of the third capacitor is coupled to the second power terminal.

7. A driving method of the shifting register according to claim 1, comprising:

in a signal holding output period, controlling, by the input sub-circuit, the first node to be in a maintained state according to signals of the input signal terminal and the first clock signal terminal; and controlling, by the control sub-circuit, the second node to be in a maintained state by the first power terminal or the second power terminal under control of the first clock signal terminal, the second clock signal terminal and the signal input terminal, so that the signal output terminal outputs a delay holding signal;

in a high-level signal outputting period, controlling, by the input sub-circuit, the first node to be in an off state according to the signals of the input signal terminal and the first clock signal terminal; and controlling, by the control sub-circuit, the second node to be in an on state by the first power terminal or the second power terminal under control of the first clock signal terminal, the second clock signal terminal and the signal input terminal, so that the signal output terminal outputs a high-level signal; and in a low-level signal outputting period, controlling, by the input sub-circuit, the first node to be in an on state according to the signals of the input signal terminal and the first clock signal terminal; and controlling, by the control sub-circuit, the second node to be in an off state by the first power terminal or the second power terminal under control of the first clock signal terminal, the second clock signal terminal and the signal input terminal, so that the signal output terminal outputs a low-level signal.

8. A gate driving circuit, comprising a plurality of cascaded shifting registers according to claim 1; wherein an input signal terminal of a first stage of shifting register is configured to be coupled to a frame start signal terminal; and in every two adjacent shifting registers, an input signal terminal of a next stage of shifting register is configured to be coupled to an output terminal of a previous stage of shifting register.

9. A display device, comprising the gate driving circuit according to claim 8.

10. The gate driving circuit according to claim 8, wherein the input sub-circuit comprises a fifth transistor; and a gate of the fifth transistor is coupled to the first clock signal terminal, a first electrode of the fifth transistor is coupled to the signal input terminal, and a second electrode of the fifth transistor is coupled to the first node.

11. The gate driving circuit according to claim 8, wherein the control sub-circuit further comprises a sixth transistor; and a gate of the sixth transistor is coupled to the first clock signal terminal, a first electrode of the sixth transistor is coupled to the first power terminal, and a second electrode of the sixth transistor is coupled to the gate of the third transistor.

12. The gate driving circuit according to claim 8, wherein the control sub-circuit further comprises a first capacitor; and a first terminal of the first capacitor is coupled to the gate of the third transistor, and a second terminal of the first capacitor is coupled to the second electrode of the third transistor.

13. The gate driving circuit according to claim 8, wherein the output sub-circuit comprises a seventh transistor, an eighth transistor and a second capacitor;

a gate of the seventh transistor is coupled to the first power terminal, a first electrode of the seventh transistor is coupled to a second electrode of a fifth transistor, and a second electrode of the seventh transistor is coupled to a gate of the eighth transistor;

a first electrode of the eighth transistor is coupled to the first power terminal, and a second electrode of the eighth transistor is coupled to the signal output terminal; and a first terminal of the second capacitor is coupled to the gate of the eighth transistor, and a second terminal of the second capacitor is coupled to the signal output terminal.

14. The gate driving circuit according to claim 8, wherein the output sub-circuit further comprises a ninth transistor, a tenth transistor and a third capacitor;

a gate of the ninth transistor is coupled to a first electrode of a seventh transistor, a first electrode of the ninth transistor is coupled to the second power terminal, and a second electrode of the ninth transistor is coupled to a gate of the tenth transistor;

a first electrode of the tenth transistor is coupled to the signal output terminal, and a second electrode of the tenth transistor is coupled to the second power terminal; and a first terminal of the third capacitor is coupled to the gate of the tenth transistor, and a second terminal of the third capacitor is coupled to the second power terminal.

* * * * *